(12) United States Patent
Schulze et al.

(10) Patent No.: US 8,275,564 B2
(45) Date of Patent: Sep. 25, 2012

(54) PATTERNED WAFER INSPECTION SYSTEM USING A NON-VIBRATING CONTACT POTENTIAL DIFFERENCE SENSOR

(75) Inventors: Mark A. Schulze, Austin, TX (US); Jun Liu, Marietta, GA (US); Jeffrey Alan Hawthorne, Decatur, GA (US)

(73) Assignee: Qcept Technologies, Inc., Atlanta, GA (US)

( * ) Notice: Subject to any disclaimer, the term of this patent is extended or adjusted under 35 U.S.C. 154(b) by 410 days.

(21) Appl. No.: 12/694,116

(22) Filed: Jan. 26, 2010

(65) Prior Publication Data

US 2010/0198389 A1 Aug. 5, 2010

Related U.S. Application Data

(60) Provisional application No. 61/149,605, filed on Feb. 3, 2009.

(51) Int. Cl.
*G01D 18/00* (2006.01)

(52) U.S. Cl. ............ 702/85; 702/57; 702/117; 702/150; 702/189

(58) Field of Classification Search ............ 702/57, 702/85, 117, 150, 189; 700/110; 438/10, 438/17; 356/433; 324/500, 754.01, 754.21; 250/307

See application file for complete search history.

(56) References Cited

U.S. PATENT DOCUMENTS

| | | | |
|---|---|---|---|
| 7,202,691 B2 * | 4/2007 | Lagowski et al. | 324/754.21 |
| 7,752,000 B2 * | 7/2010 | Schulze et al. | 702/85 |
| 2004/0169851 A1 | 9/2004 | Yang et al. | |
| 2004/0196031 A1 | 10/2004 | Nagano | |

FOREIGN PATENT DOCUMENTS

| | | |
|---|---|---|
| JP | 11-287630 A | 10/1999 |
| JP | 2006-098150 A | 4/2006 |

OTHER PUBLICATIONS

International Search Report for International Application No. PCT/US2010/022139, dated Aug. 9, 2010.

* cited by examiner

*Primary Examiner* — Mohamed Charioui
*Assistant Examiner* — Elias Desta
(74) *Attorney, Agent, or Firm* — Foley & Lardner LLP

(57) ABSTRACT

A method and system for inspecting a surface of a material having a repeating pattern of relative work function. The method and system processes sensor data to identify data characteristic of the repeating pattern, and the sensor data is then further processed to remove the data characteristic of the repeating data, leading to a characteristic of non-uniformities of the material surface.

16 Claims, 19 Drawing Sheets

PATTERNED WAFER INSPECTION SYSTEM USING A NON-VIBRATING CONTACT POTENTIAL DIFFERENCE SENSOR

CROSS-REFERENCE TO RELATED PATENT APPLICATIONS

This application claims priority from U.S. Provisional Application No. 61/149,605, filed Feb. 3, 2009. The contents of this application is incorporated herein by reference in its entirety.

FIELD OF THE INVENTION

The present invention is directed to methods and systems for the inspection of surfaces and materials, including semiconductor surfaces and semiconductor materials. More particularly, the present invention is directed to methods for detecting and measuring surface or subsurface non-uniformities and/or charges using a non-vibrating contact potential difference sensor on a surface that contains a repeating pattern of work function variation.

BACKGROUND OF THE INVENTION

The function, reliability and performance of semiconductor devices depend on the use of semiconductor materials and surfaces which are clean and uniform. Billions of dollars and countless man-hours have been spent developing, characterizing, and optimizing systems and processes for fabricating and processing semiconductor materials. A primary goal of this activity has been the fabrication of materials and surfaces that are extremely clean and that have predetermined and desired properties that are uniform, vary uniformly or vary in a programmed manner, across the entire wafer. In order to characterize and optimize these processes and the resulting material, it is necessary to be able to inspect and measure surface or bulk cleanliness and uniformity or the precise variation of properties over all the surface. For real-time process control, it is necessary to be able to make many measurements across a surface at high speed, and to do so in a manner that does not damage or contaminate the semiconductor surface.

The technologies available for the inspection of patterned wafers are very limited. The most common methods and systems use optical, or light based technologies to inspect for particles, scratches or other types of physical defects. They operate by illuminating the surface with broadband, narrowband, or laser light, collecting the scattering or reflected light using optics, and acquiring images using photosensors such as Charged Coupled Devices (CCDs), Time Delay Integration (TDI) sensors, or Photo Multiplier Tubes (PMTs). These systems then process these images to detect physical defects such as particles and scratches. Alternatively, e-beam technology can be used by subjecting the wafer to high vacuum, accelerating electrons onto the wafer surface, collecting the scattered electrons from the surface, and acquiring images using scintillators and PMTs. These types of systems are not however able to detect sub-monolayer chemical non-uniformities in, or on, the wafer surface; and are not able to detect pre-existing charge variation across the wafer. Technologies that are capable of detecting small chemical variations are not suitable for the inspection of patterned wafers because they lack the speed or resolution to inspect the whole wafer, are destructive, or are not suitable for use on complex surfaces that include significant material and geometric variations. For example, Time-of-Flight Secondary Ion Mass Spectrometry (TOF-SIMS) is often used to characterize the chemical composition of a surface, but is much too slow to image large areas of a wafer and is primarily used for analysis of one or more points. Such technology is not commercially useful due to these deficiencies. Total Reflection X-ray Fluorescence (TXRF) is often used to detect metals at selected points on the surface of bare or blanket wafers, but lacks the speed and resolution to image patterned wafer surfaces. In addition, the results are confused by the variations in surface chemistry that occur on patterned wafers. In general, these types of non-optical tools are used to characterize test structures or review defects detected by optical tools. However, there is no viable technology for inspecting whole patterned wafers to detect chemical or charging non-uniformities that can significantly impact semiconductor device performance or yield. Consequently, there is a long felt need for a method for rapid and accurate analysis of nonuniformities or defects present on surfaces, such as semiconductor wafers.

SUMMARY OF THE INVENTION

In this method of the invention a non-vibrating contact potential difference sensor is utilized. The non-vibrating contact potential difference sensor consists of a conductive probe that is positioned close to a surface, and is electrically connected to the surface. The probe and the surface form a capacitor. An electrical potential is formed between the probe tip and the surface due to the difference in work functions or surface potentials of the two materials. This electrical potential is called the contact potential difference, or surface potential difference, between the two surfaces. The probe tip is translated parallel to the surface, or the surface is translated beneath the probe. The work function of the probe tip does not vary, but changes in the work function or surface potential at different points on the surface result in changes in contact potential difference between the surface and the probe tip. These changes in electrical potential cause an electrical current to flow in or out of the sensor probe tip. This current is amplified, converted to a voltage, and sampled to form a continuous stream of data which represents changes in potential across the measured surface. The non-vibrating contact potential difference sensor can provide a continuous stream of data at rates greater than 100,000 samples per second. High data acquisition rates permit high-resolution images of whole semiconductor wafers to be acquired in only a few minutes.

The system and methods described in this invention provide an enhanced application of a non-vibrating contact potential difference inspection system that allows the rapid imaging of surfaces and the detection of work function non-uniformities on surfaces that contain a repeating or other preprogrammed pattern of relative work function values. This capability is particularly useful for the detection of chemical or charge-related defects on patterned semiconductor wafers, or other preprogrammed pattern arrangements on wafers, during the manufacturing process.

In preferred embodiments the wafer and sensor are moved relative to each other to produce a contact potential difference signal characteristic of the wafer surface being scanned. This measured signal is then integrated to provide a measure of the relative work function rather than change in work function. This conversion provides advantages including the signal level in the integrated image does not vary with sensor probe trip speed relative to the wafer surface; and secondly the appearance of any particular feature of interest no longer varies with position around the wafer. Once integration is complete, the resulting data is preferably converted from radial coordinates to linear perpendicular, or Cartesian coordinates, for the radial scanning methodology. This transformation then allows performing data analysis more readily.

In other aspects of preferred embodiments various suppression techniques can be used to remove a basic repeating pattern to enable analysis of non-uniformities or deviations from a desired wafer surface.

Other features and advantages of the invention will become apparent from the following description of preferred embodiments taken in conjunction with the accompanying drawings described below.

DETAILED DESCRIPTION OF PREFERRED EMBODIMENTS

Figure 1:
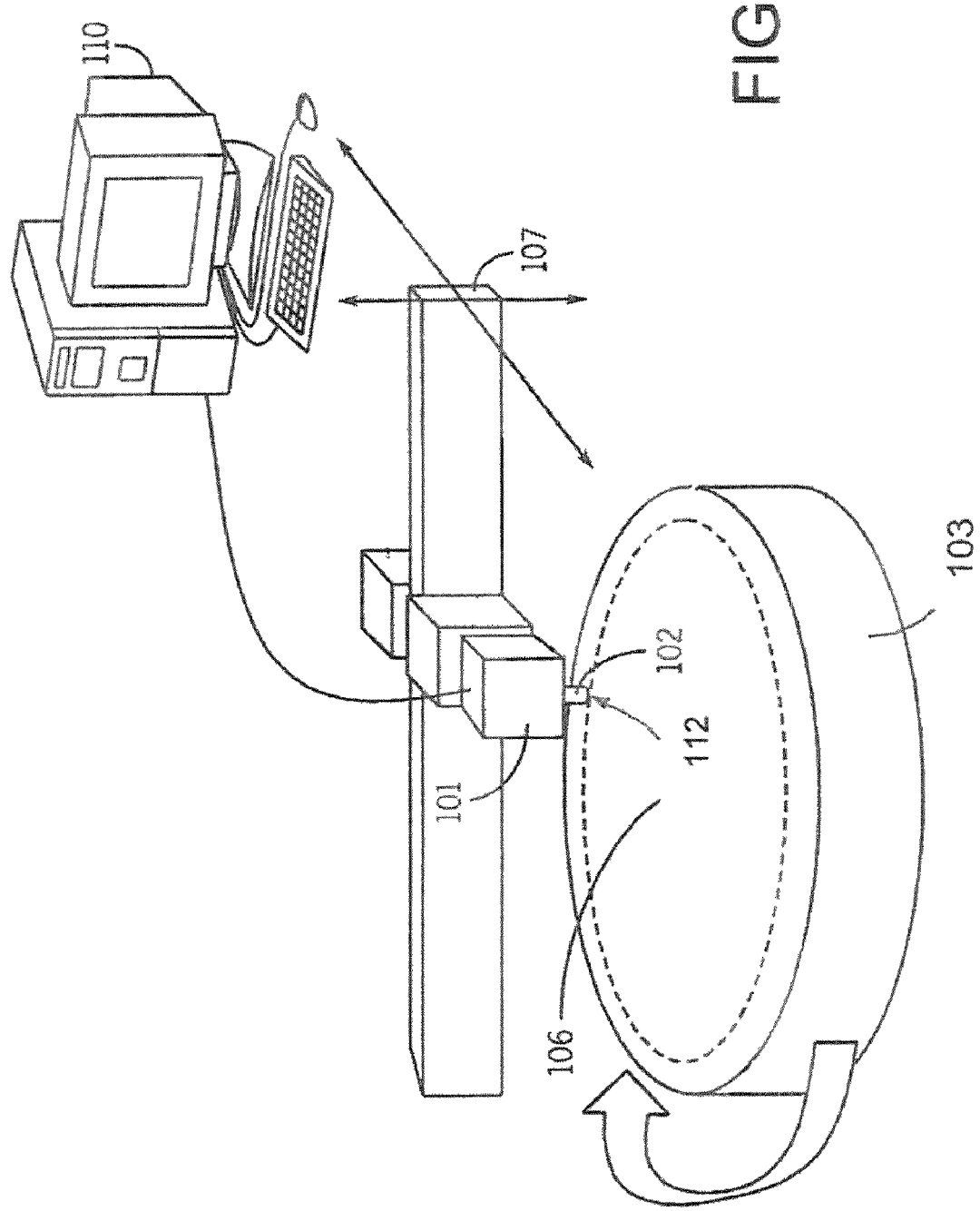
FIG. 1 shows a system for performing methods of the invention.

A system 100 for performing various methods of the invention is illustrated in FIG. 1. This system 100 is used to inspect a wafer 106. Hereinafter, material susceptible to inspection by the system 100 herein described will be denoted generally as a "wafer". The invention includes a sensor or sensors 101 attached to position assembly 107 and coupled to probe tip 102. The positioning assembly 107 enables positioning of the sensor 101 capable of non-vibrating contact potential difference measurements. The system 100 mechanically holds the wafer 106 with fixture 103 while the system 100 electrically connects the sensor probe tip 102 to the wafer 106. The system further positions the sensor probe tip 102 a fixed distance above the wafer surface and is able to generate relative lateral motion (and selectably continuous motion) between the probe tip 102 and the wafer surface such that the sensor probe tip 102 moves substantially parallel to the wafer surface. The system 100 utilizes computer/display system 110 and controls scanning of the sensor 101 and acquires and processes the output signal from the sensor 102 to identify and classify wafer non-uniformities. As described in detail hereinafter, the system 100 carries out methods for processing the resulting data to remove signals generated by a repeating pattern (or other preprogrammed pattern) and detects work function non-uniformities that are not part of this repeating pattern (or other preprogrammed pattern). Hereinafter, repeating patterns (or other preprogrammed patterns) on the wafer 106 shall be referred to as "die 200" or "dice 200," (see FIGS. 2-18), though such patterns may also represent structures such as test patterns, dice, reticle fields, or substructures within such test patterns, dice, or reticles.

One important characteristic of the non-vibrating contact potential difference sensor is that it produces data that is differential. This means that the sensor 101 generates data that represents differences, or changes, in surface potential or work function across the measured surface. The output of the sensor represents changes in surface potential only in the direction of travel of the sensor probe tip relative to the surface, and the magnitude of the sensor output is proportional to the speed of the probe tip 102 relative to the measured surface. As a result, the appearance of a non-uniformity in the scanned image depends on the direction of travel and speed of the sensor probe tip 102 as it crosses the feature on the measured surface of the wafer 106.

The non-vibrating contact potential difference sensor 101 relies on relative motion between the probe tip 102 and measured surface to generate a signal. The act of moving the sensor probe tip 102 parallel to the wafer surface to generate a signal is called scanning. As shown in FIG. 1, one option for generating the scanning motion is to rotate the wafer 106 beneath the sensor probe tip 102 and move the sensor 101 or the wafer 106 along a radius of the wafer 106 to acquire a series of concentric circular tracks 112 at different radii from the wafer center. These concentric tracks 112 can then be assembled into an image of the scanned surface. This type of scanning operation is often called radial scanning because the probe tip 102 is moved along a radius of the wafer 106.

With radial scanning, the spinning motion of the wafer 106 provides relative motion between the probe tip 102 and measured surface without the high accelerations and decelerations required by a raster, or back and forth, scanning operation. With radial scanning, the wafer 106 can be spun at a fixed or slowly varying speed, and the sensor 101 can be moved small distances with low accelerations from one radial track to the next. As a result, the wafer surface can be scanned in a much shorter period of time with much less vibration and lower power consumption than with raster scanning.

During the integrated circuit manufacturing process, many identical devices are manufactured on a single one of the circular wafer 106. These devices are arranged in rows and columns to form a repeating pattern across the wafer surface. Each device is called a die 200 (see for example, FIG. 2 and all the examples described hereinafter). During manufacturing, various materials are deposited on, removed from, or otherwise modified in this repeating pattern to produce the multiple ones of the die 200 that are present on the wafer 106. The different materials and processes create surfaces with different work functions. These differences in work function produce a signal when scanned with the non-vibrating contact potential difference sensor 101. In order to inspect these surfaces for work function non-uniformities that represent potential manufacturing defects, it is necessary to reduce or eliminate the signal resulting from this repeating pattern of the die 200 or other such wafer pattern.

Removing repeating patterns from images created with the radially scanning non-vibrating contact potential difference sensor 101 presents several challenges. These challenges result from the fact that the data is differential and the sensor probe tip 102 is moving in a different direction, and/or with a different relative speed, at different points on the wafer surface. As a result, a die 200 pattern at one location on the wafer 106 can appear very different from the same die 200 pattern at another location on the wafer 106. Also, the data resulting from the radial scanning operation is radial in nature, i.e. data points are located at fixed radii and angles, so the number of data points per unit area varies with radius. The die 200 on semiconductor wafers 106 are arranged in rows and columns with fixed spacing in the horizontal and vertical directions. As a result, the number and locations of data samples differ from one die 200 location to the next.

The fact that the appearance of the repeating pattern can vary depending on the location of the pattern on the wafer surface creates significant challenges in processing patterned wafer images to identify non-uniformities that are not part of the pattern. This is particularly true for images acquired using the radial scanning method, where the direction and speed of the probe tip 102 varies with location on the wafer 106. In addition to inspecting the above-described repeating pattern across the wafer, in some applications the wafer 106 may have an asymmetric pattern arrangement which can also be inspected for proper uniformity knowing the preprogrammed arrangement of patterns.

In a preferred embodiment the system 100 operates as follows. The wafer 106 is mechanically secured to the fixture 103, and the probe tip 102 is positioned a fixed distance above the wafer surface. The wafer 106 can be secured to the fixture 103 using one of a number of different means, including vacuum, electro-static attraction, and gripping the edges of the wafer 106. Relative motion is generated between the probe tip 102 and the wafer surface such that the probe tip 102 moves parallel to the wafer surface. Variations in the surface potential or work function along the wafer surface result in changes in the electrical potential between the probe tip 102 and the wafer surface, which results in a current into, or out of, the sensor probe tip 102. This current is converted to a voltage and sampled to generate digital data representative of changes in work function in the direction of travel of the sensor probe tip 102. By moving the sensor 101 over different areas of the wafer surface, data can be generated and assembled into an image of the wafer 106 using the computer/display 110. In addition, embedded computer software in a computer memory of the computer/display 110 enables execution of various computer programs using conventional analytical methods to carry out the method of the invention.

Various methods exist for moving the sensor 101 and the wafer 106 to generate data that covers some, or all, of the wafer surface. This often involves acquiring multiple sets of consecutive data points, where each set of consecutive points is called a track. As described herein before, one possible method of scanning the wafer surface involves spinning the wafer 106 and moving the sensor 101 or the wafer 106 so that the sensor 101 moves along a radius of the wafer 106. This results in multiple tracks of data corresponding to concentric circular regions of the wafer surface, or a single track of data that corresponds to a spiral from the edge of the wafer 106 to the center. In either case, if the wafer 106 is spun at a fixed speed then the speed of the probe tip 102 relative to the wafer surface will decrease as the distance between the probe tip 102 and the center of rotation decreases. This results in a change in signal strength at different points on the wafer surface. Also, since the probe tip 102 travels in a circular pattern, the direction of travel of the probe tip 102 varies with location of the probe tip 102 relative to the wafer surface. As a result, the appearance of a feature will depend on its location on the wafer surface.

After the wafer surface is scanned using the non-vibrating contact potential difference sensor 101, then each track is integrated. This is accomplished by replacing each data point in a track by the sum of that data point and all previous data points in the track. For example, the first data point in a track is unchanged, the second data point is replaced by the sum of the first data point and the second data point, and the one hundredth data point in the track is replaced by the sum of the first through one hundredth data points. A constant is then added to each point in the integrated track to establish the average level of that track. This is sometimes accomplished by subtracting the average of all data points in the track from each data point in the track, but may also be accomplished using more elaborate algorithms to establish the appropriate level.

Integration results in data that represents relative work functions rather than changes in work function. This integrated data provides at least two significant benefits. First, as long as the data sampling rate is fixed, the signal level in the integrated image does not vary with the speed of the probe tip 102 relative to the wafer surface. This is because the distance between data points varies linearly with probe speed so that the density of data points varies as the inverse of the signal strength. As a result, after integration each data point represents a correct relative work function value within that particular track 112, regardless of the relative speed between the probe tip 102 and the wafer 106. Second, the appearance of a feature no longer varies with position around the wafer 106. Because the data now represents relative work function, features with the same work function value will have the same, or nearly the same, value in the integrated image independent of the position of the features on the wafer surface.

After integration, the data is converted from radial coordinates to perpendicular linear coordinates, often called Cartesian coordinates. This is not necessary for scanning operations that result in parallel linear tracks of data. However, if the radial scanning method is used, then the number and position of data points is not constant in the horizontal and vertical directions. This makes subsequent image processing to reduce or suppress the repeating pattern very difficult, because the die 200 are arranged in evenly spaced horizontal and vertical rows and columns. One method of suppressing a repeating pattern in a signal is to filter out the frequencies associated with the pattern. This is accomplished by transforming the spatial data into the frequency domain, removing the frequencies associated with the pattern, and then transforming the data back into the spatial domain. Identifying and removing peaks associated with the pattern from the frequency domain requires that the spatial data be evenly distributed with respect to the repeating nature of the pattern, i.e. that the data be distributed evenly in the horizontal and vertical directions. Another method of suppressing a repeating pattern is to subtract a statistical average of the neighboring die 200, or a statistical average of all of the dice 200 on the wafer 106, from each of the die 200. This operation is greatly facilitated if the density and position of data is the same for each of the die 200 on the wafer 106. If radial scanning is used to acquire data with radial coordinates, then the density and position of data is different for every one of the die 200. Transforming radial data to Cartesian coordinates that are evenly spaced along the horizontal and vertical axes greatly facilitates this type of pattern suppression.

After the data is integrated and converted to Cartesian coordinates, one of various algorithms is used to suppress the repeating pattern within the wafer image. This processing may take many forms, three of which are described here.

The first pattern suppression option requires the generation of a "golden" wafer image standard with no defects. The image of each of the wafers 106 to be inspected is aligned and subtracted from the "golden" wafer image. Features which are common to both of the wafer images are removed, greatly reducing the signal from the common pattern. Optionally, the signal level of each wafer image can be matched to the signal level of the "golden" wafer image prior to subtraction if there is substantial pattern signal level variation between the wafers 106. This pattern suppression technique can be used with radial data and does not require that the image be converted to Cartesian coordinates.

A second pattern reduction processing option is to convert the Cartesian image into the frequency domain using the two dimensional Fourier transform. This frequency domain image is filtered using a filter specified by the user or calculated based on user specified parameters. This filter is designed to remove frequencies associated with the repeating pattern. The filtered image is then converted back into the spatial domain for subsequent processing.

A third option for reducing the signal associated with the repeating pattern is to subtract the image of each of the die 200 from one or more neighboring die and then analyzing the resulting differences to identify defects. This analysis can take many forms. For example, a statistical average of the resulting differences can be calculated, or the median value of the differences can be calculated. In each case, a pattern suppressed version of each die is calculated by comparing the die image to a statistical composite of one or more other die on the wafer. This operation minimizes the repeating pattern while having minimal effect on non-repeating non-uniformities.

The result of the preceding steps, including scanning with a non-vibrating contact potential difference sensor 101, integration, conversion to Cartesian coordinates, and pattern suppression is an image that is primarily of wafer non-uniformities that are not part of a repeating pattern. This image is then processed to identify features in the image that represent unintended non-uniformities that are defects. This is usually accomplished by selecting a range of signal levels that represent defects, and then identifying these regions by thresholding the image.

The following Examples illustrate, without limitation, various aspects of the invention. While these examples are limited to semiconductor wafers, the method of the invention is likewise applicable to any material in which surface uniformity analysis and background pattern removal are important.

Example I

A standard silicon test wafer 106 with a pattern applied thereto was obtained from a commercial source which routinely produces semi-conductor grade starting wafers. This wafer consisted of a repeating test pattern die that was created using a chemical mechanical planarization process. The pattern consisted of copper and a dielectric material. Drops of chemical contaminant were then deposited along radii of the wafer using a jet printing process. This wafer 106 was inspected by the system 100 to provide the image 300 shown in FIG. 2. This image 300 resulted from radially scanning the patterned wafer 106 with a non-vibrating contact potential differential sensor 101. A graphic display showing the individual die 200 is overlaid on the image. Note that the appearance of dice changes depending on the location of the die 200 on the wafer surface. The polarity (light or dark) of the pattern edges changes depending on the direction of travel of the scanning probe tip and the signal magnitude decreases as the probe tip 102 moves closer to the center.

Example II

Figure 2:
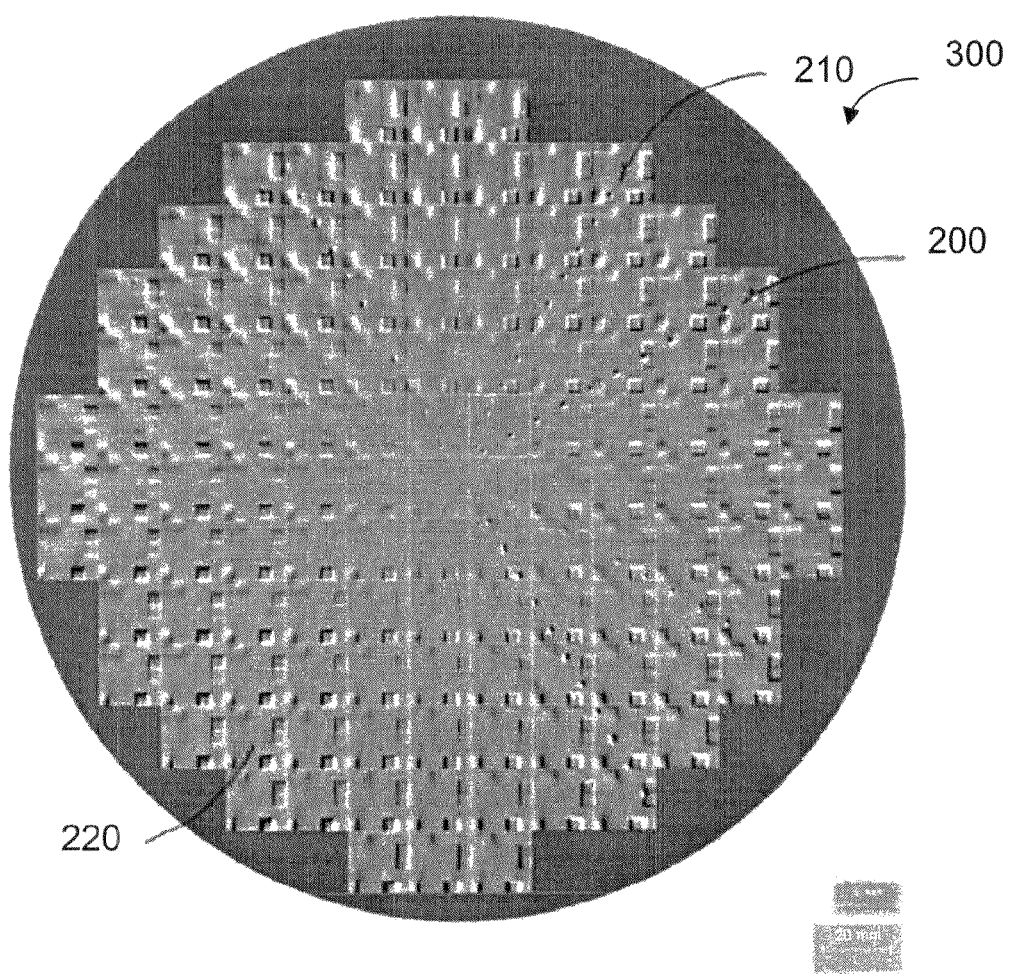
FIG. 2 shows the image resulting from radially scanning a patterned wafer with a non-vibrating contact potential difference sensor.
Figure 3:
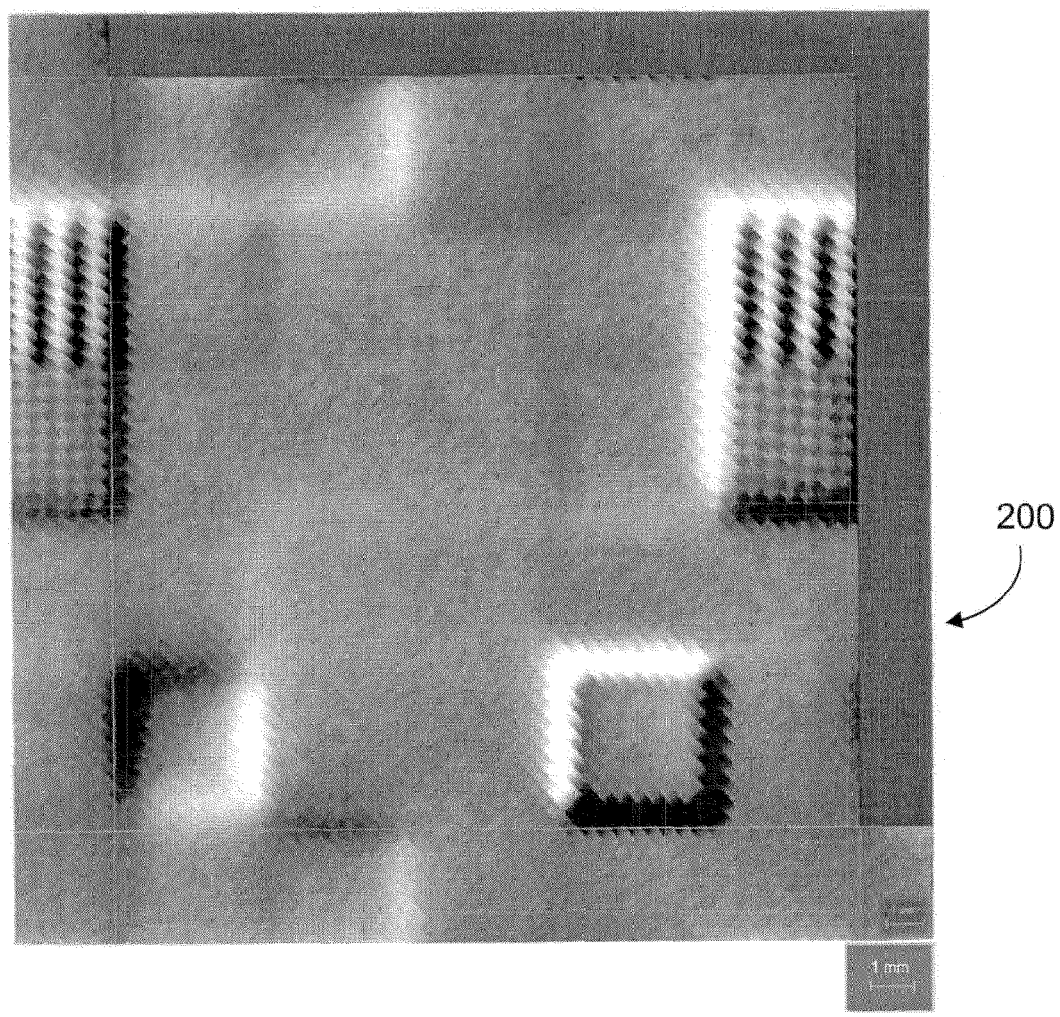
FIG. 3 shows a magnified image of a die 200 in the upper right corner of the image in FIG. 2 near the edge of the wafer; and the scanned image shows differential data, i.e. a signal generated at the edges of features.

FIG. 3 shows a magnified image of a die 200 in the upper right corner of the image in FIG. 2 near the edge of the wafer 106; and the scanned image shows differential data, i.e. a signal generated at the edges of features.

Example III

Figure 4:
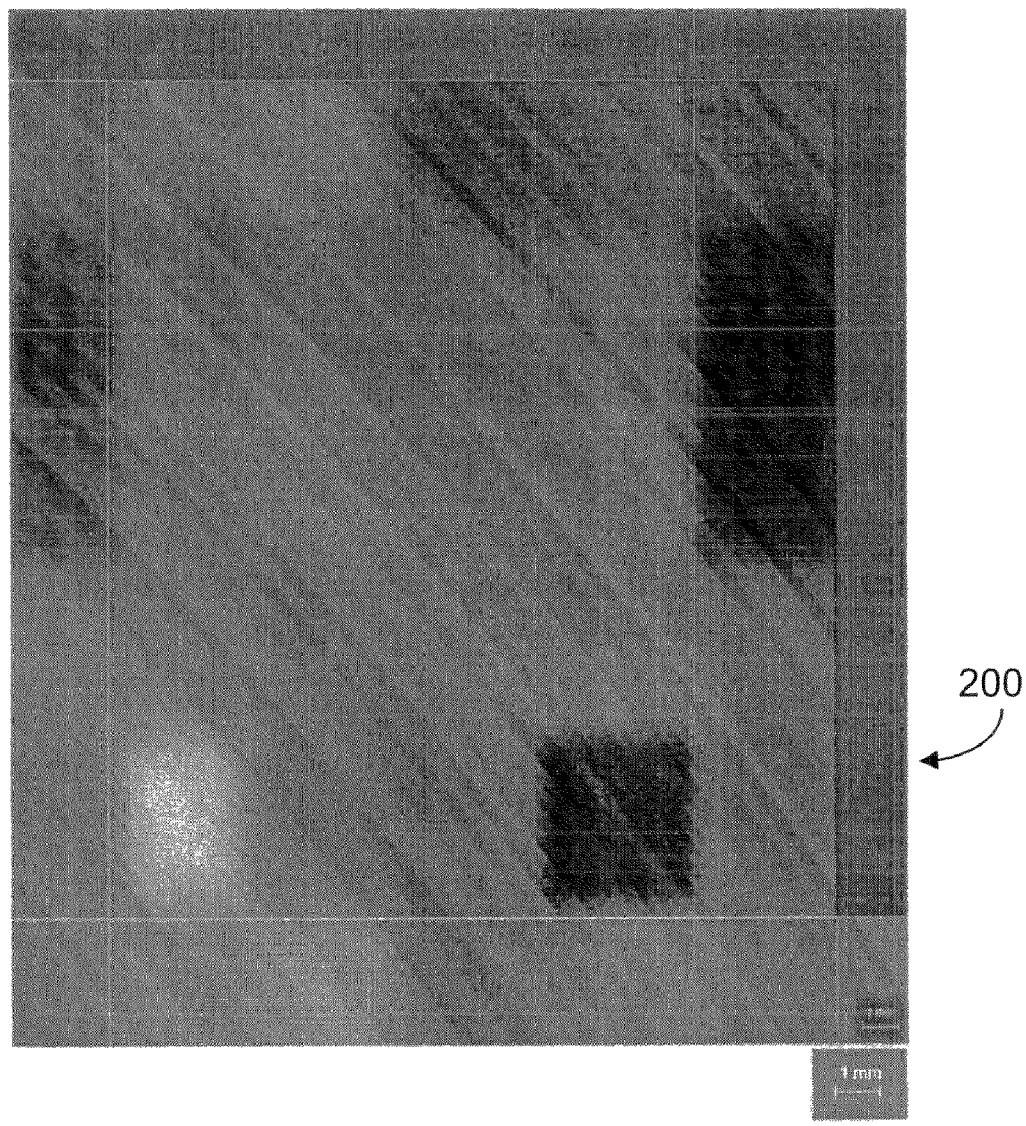
FIG. 4 shows the same die 200 as FIG. 3 after an integration step and the integrated image shows regions of relative work function.

FIG. 4 shows the same die 200 as FIG. 3 after an integration step and the integrated image shows regions of relative work function.

Example IV

Figure 5:
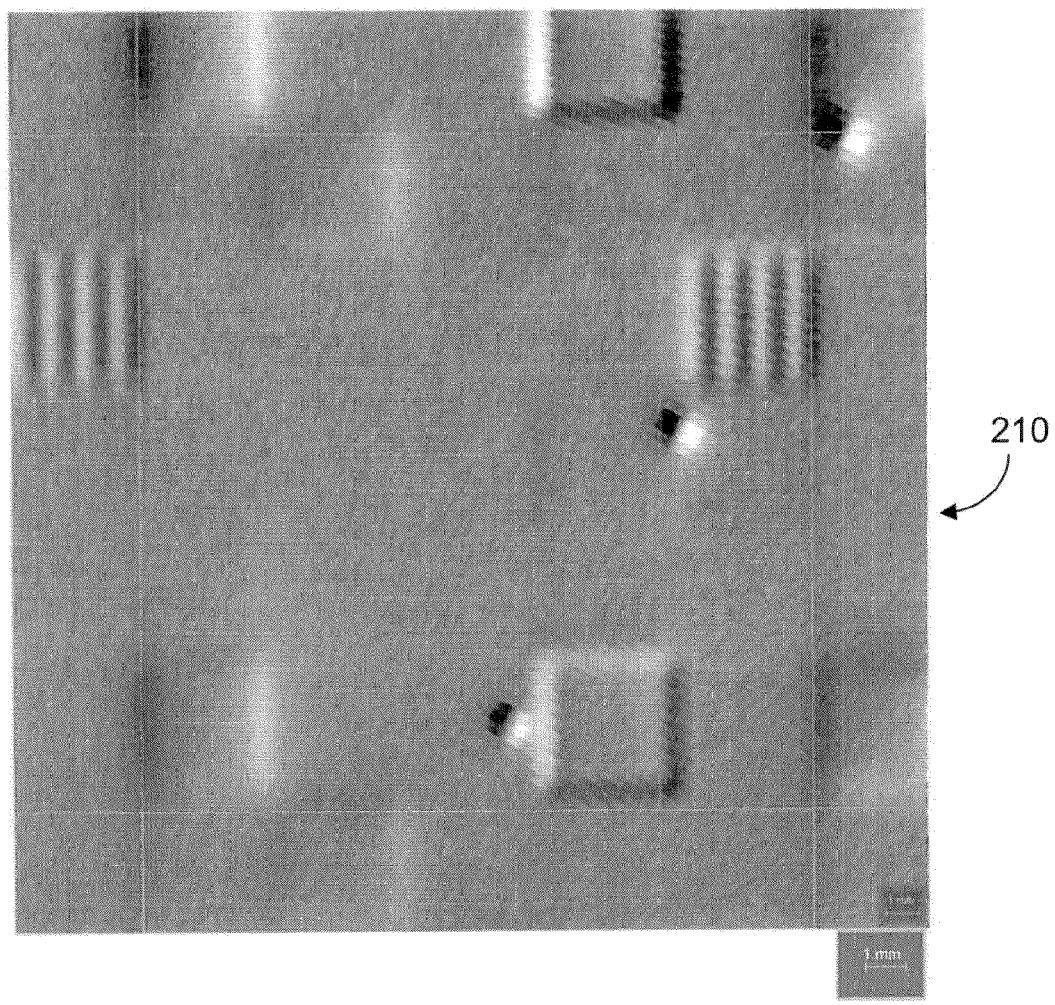
FIG. 5 shows a magnified image of a die 200 in the upper right corner of the image in FIG. 2 near the center of the wafer.

FIG. 5 shows a magnified image of a die 210 in the upper right corner of the image in FIG. 2 near the center of the wafer 106.

Example V

Figure 6:
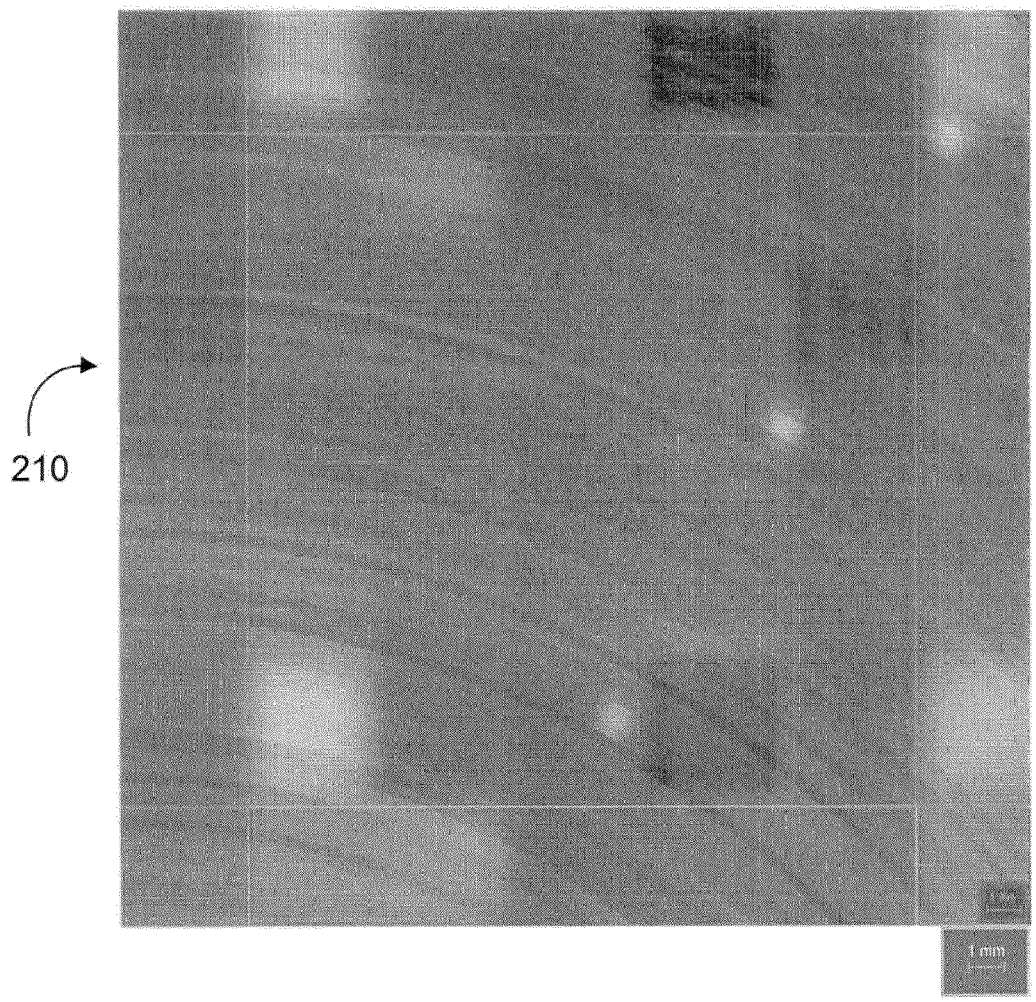
FIG. 6 shows the same die 200 as FIG. 5 after integration; and the integrated image shows regions of relative work function similar to FIG. 4.

FIG. 6 shows the same die 210 as FIG. 5 after integration; and the integrated image shows regions of relative work function similar to FIG. 4.

Example VI

Figure 7:
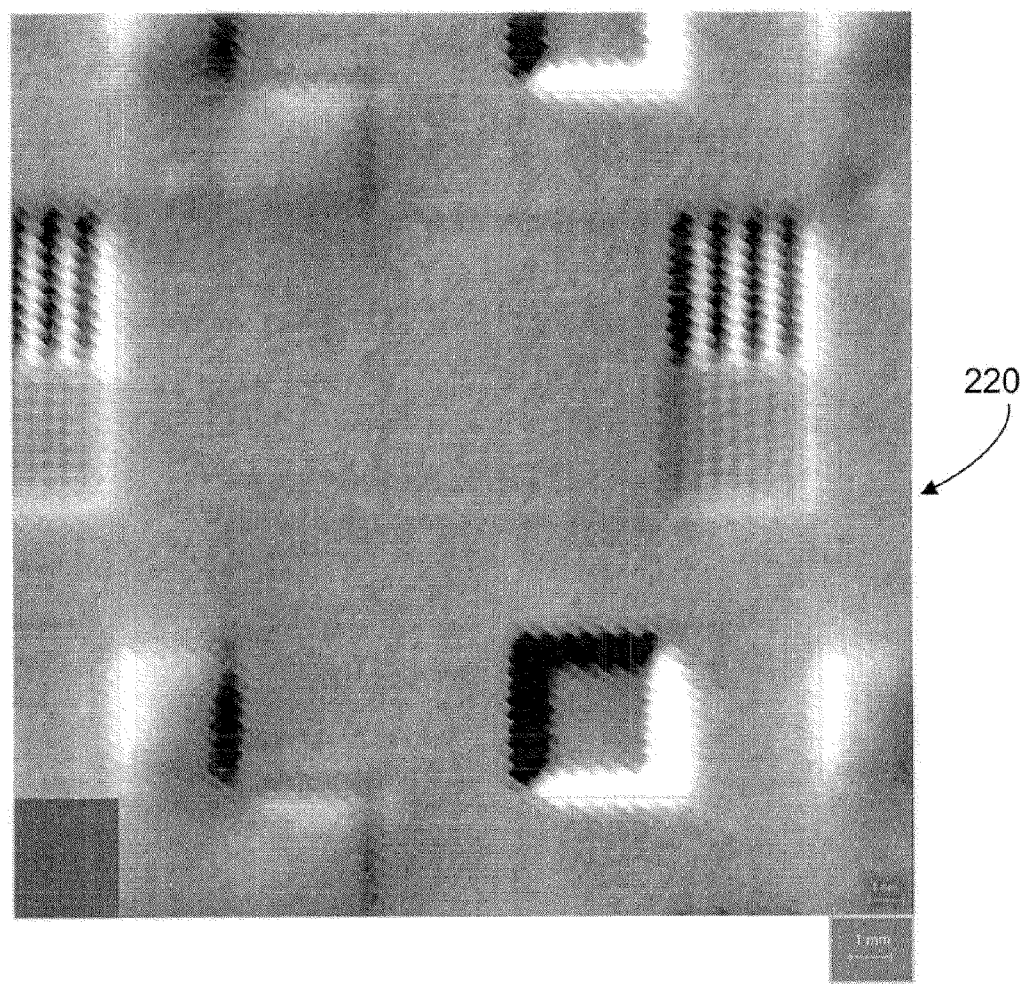
FIG. 7 shows a magnified image of a die 200 in the lower left corner of the image in FIG. 2 near the edge of the wafer.

FIG. 7 shows a magnified image of a die 220 in the lower left corner of the image in FIG. 2 near the edge of the wafer 106.

Example VII

Figure 8:
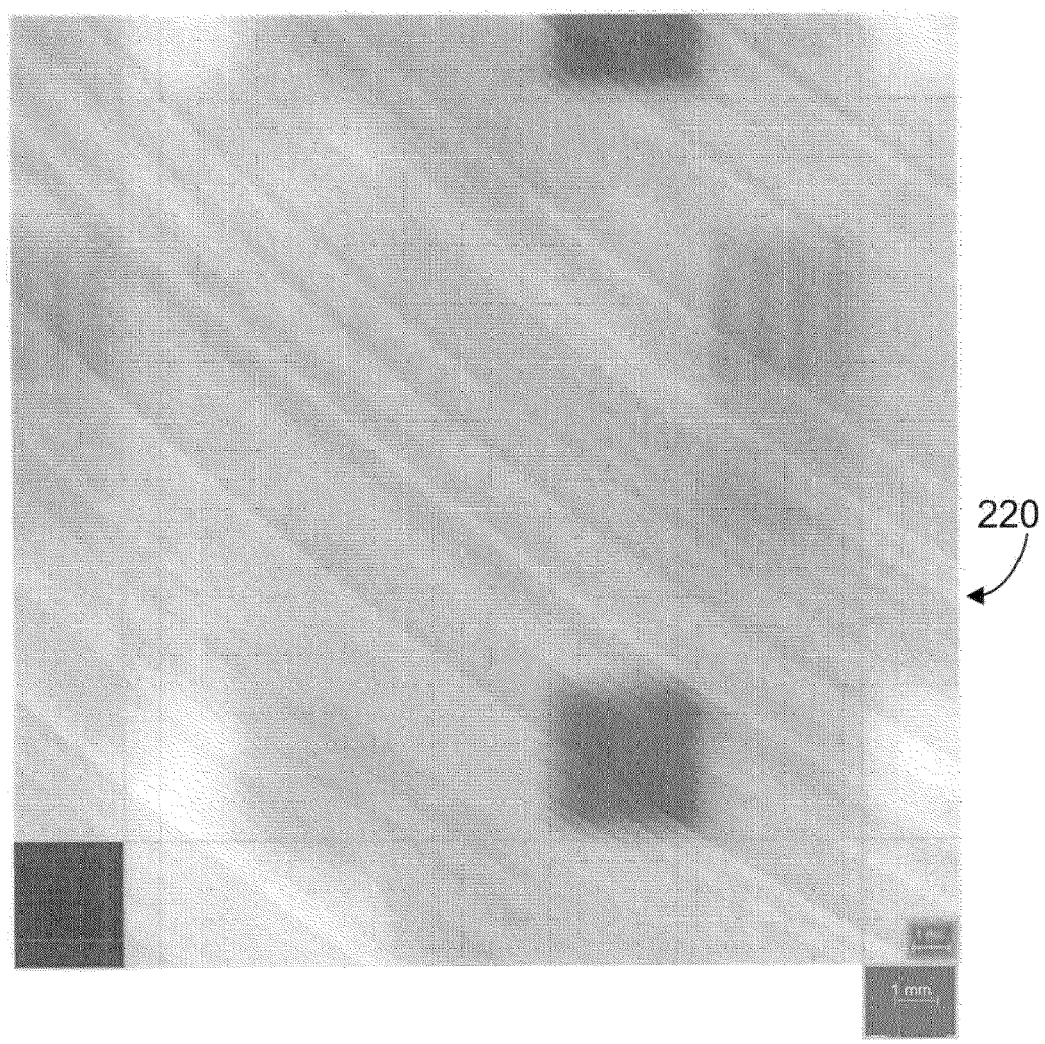
FIG. 8 shows the same die 200 as FIG. 7 after integration; and the integrated image shows regions of relative work function similar to FIGS. 4 and 6.

FIG. 8 shows the same die 220 as FIG. 7 after integration; and the integrated image shows regions of relative work function similar to FIGS. 4 and 6.

Example VIII

Figure 9:
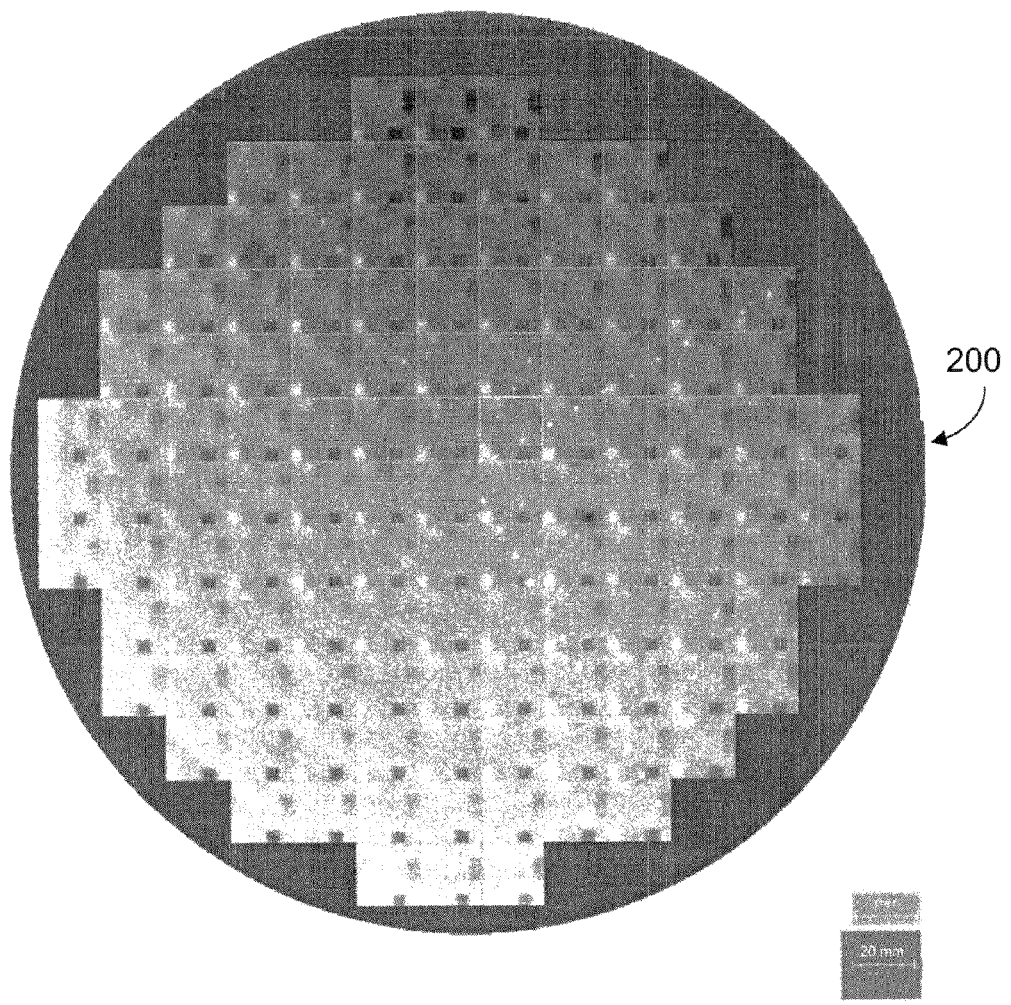
FIG. 9 shows the whole wafer image in FIG. 2 after integration; and the integrated image shows regions of relative work function.

FIG. 9 shows the whole wafer image in FIG. 2 after integration; and the integrated image shows regions of relative work function.

Example IX

Figure 10:
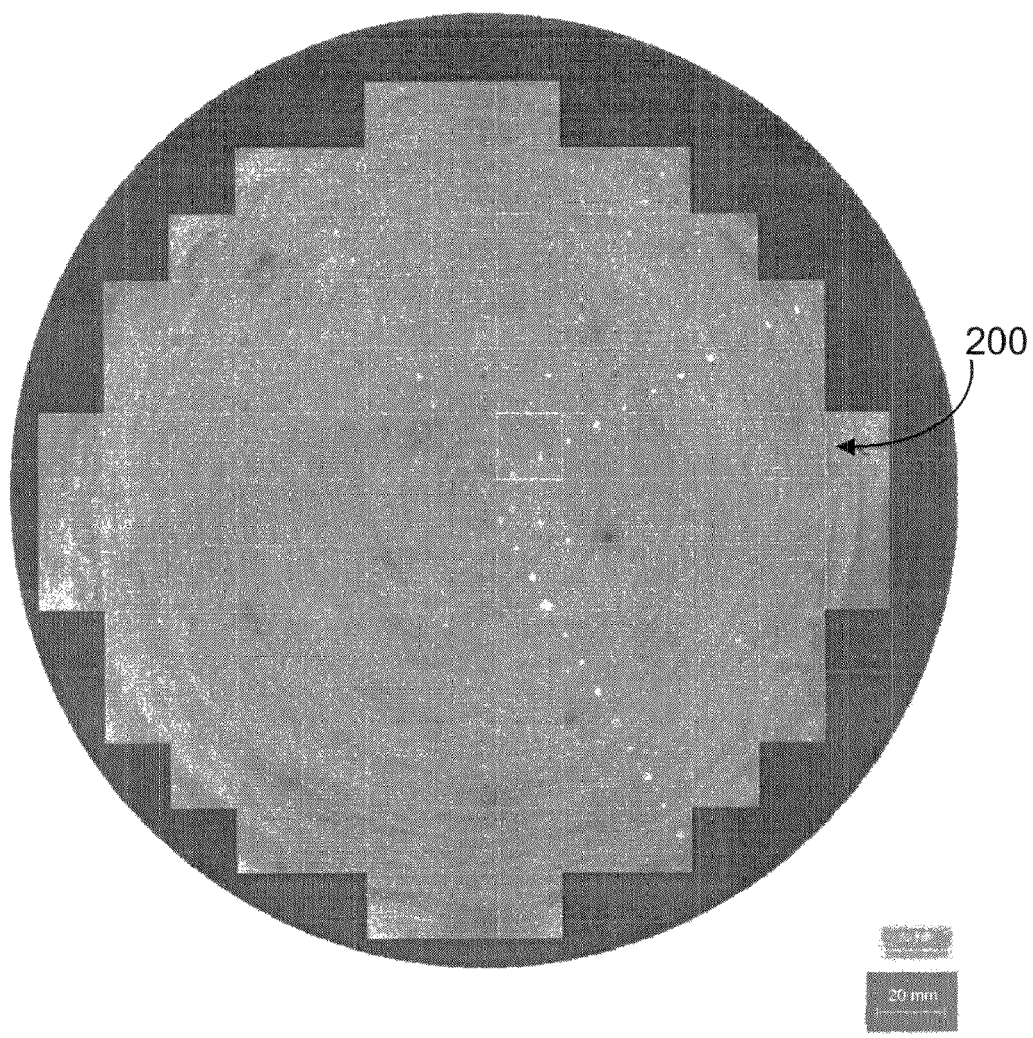
FIG. 10 shows the integrated wafer image in FIG. 9 after performing a die 200-to-die 200 subtraction operation.

FIG. 10 shows the integrated wafer image in FIG. 9 after performing a die 200-to-die 200 subtraction operation.

Example X

Figure 11:
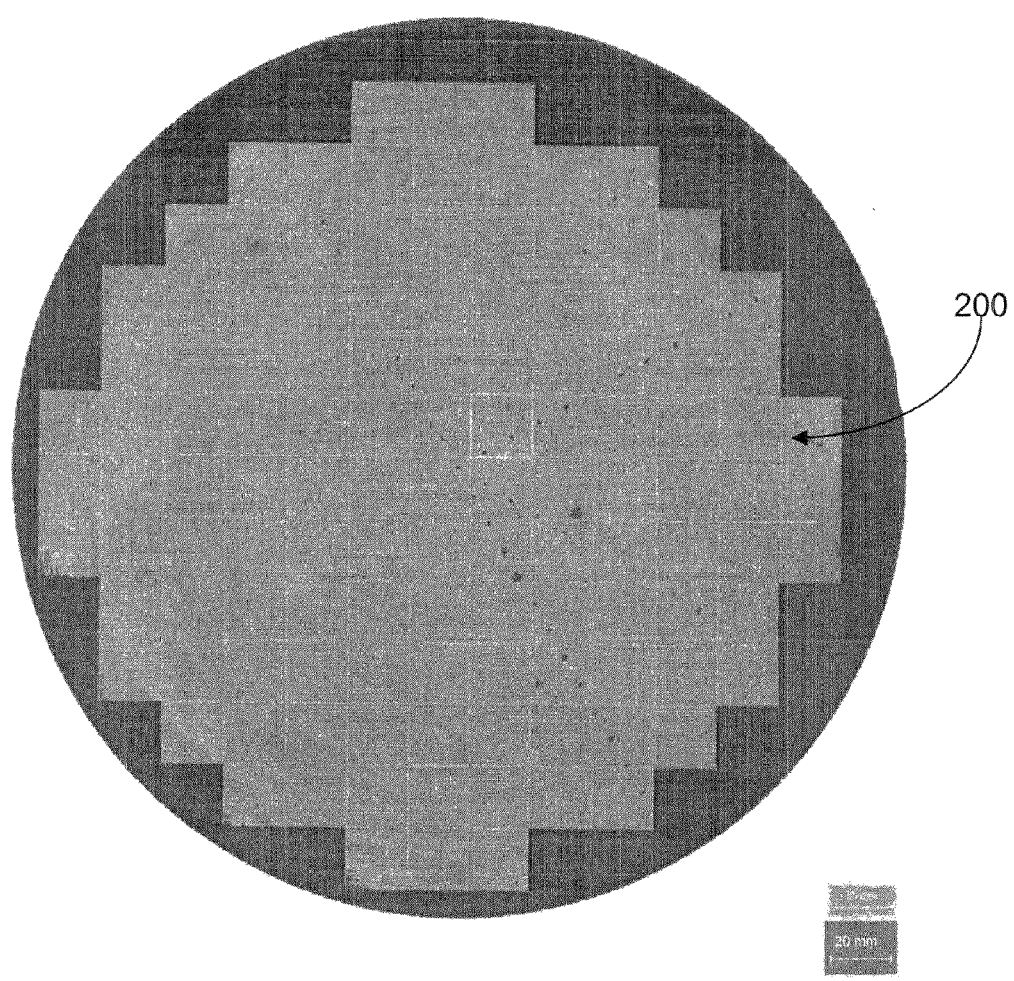
FIG. 11 shows the wafer image in FIG. 10 after thresholding.

FIG. 11 shows the wafer image in FIG. 10 after thresholding.

Example XI

Figure 12:
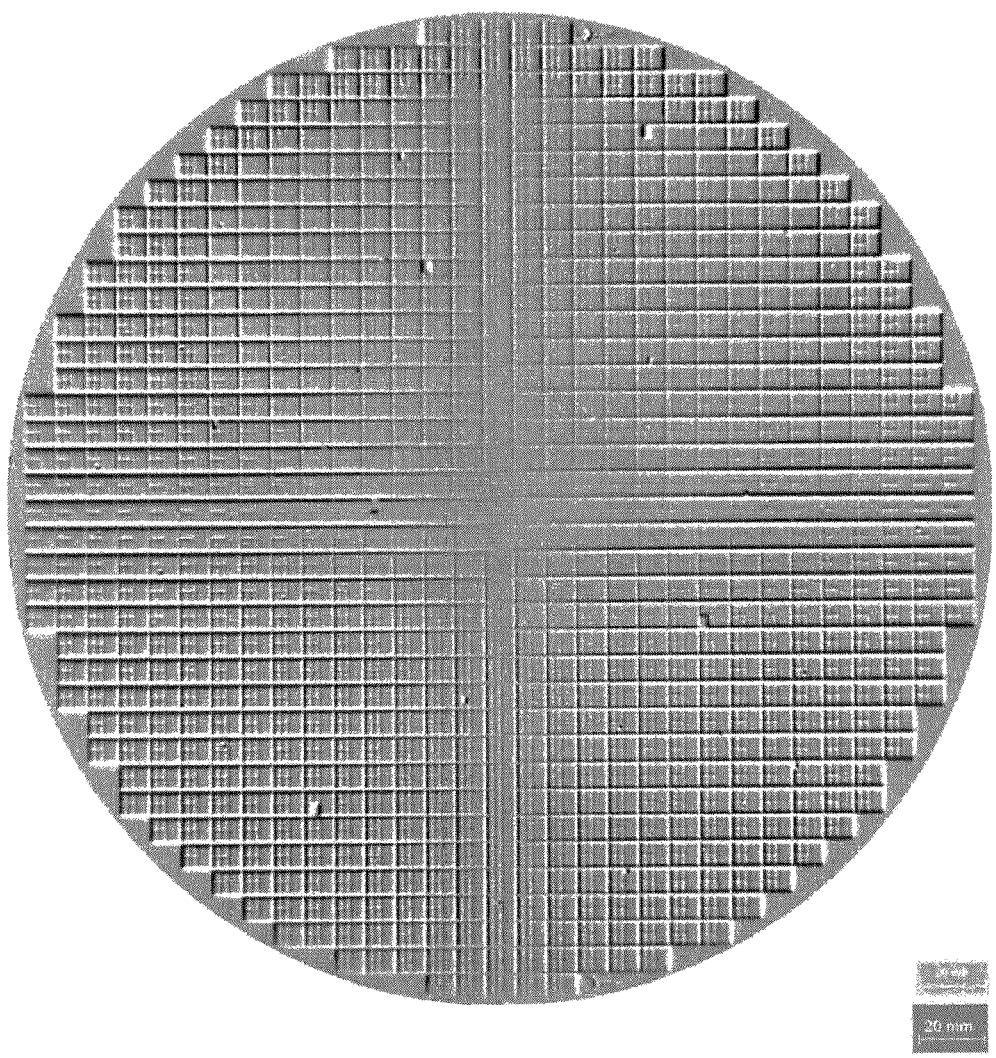
FIG. 12 shows the image resulting from radially scanning a second patterned wafer with a non-vibrating contact potential difference sensor.

FIG. 12 shows the image resulting from radially scanning a second patterned test wafer 106 with a non-vibrating contact potential difference sensor 101. This wafer was fabricated using a patterned film of chrome on top of a continuous film of titanium. Features of different sizes were embedded in the repeating pattern as part of the fabrication process.

Example XII

Figure 13:
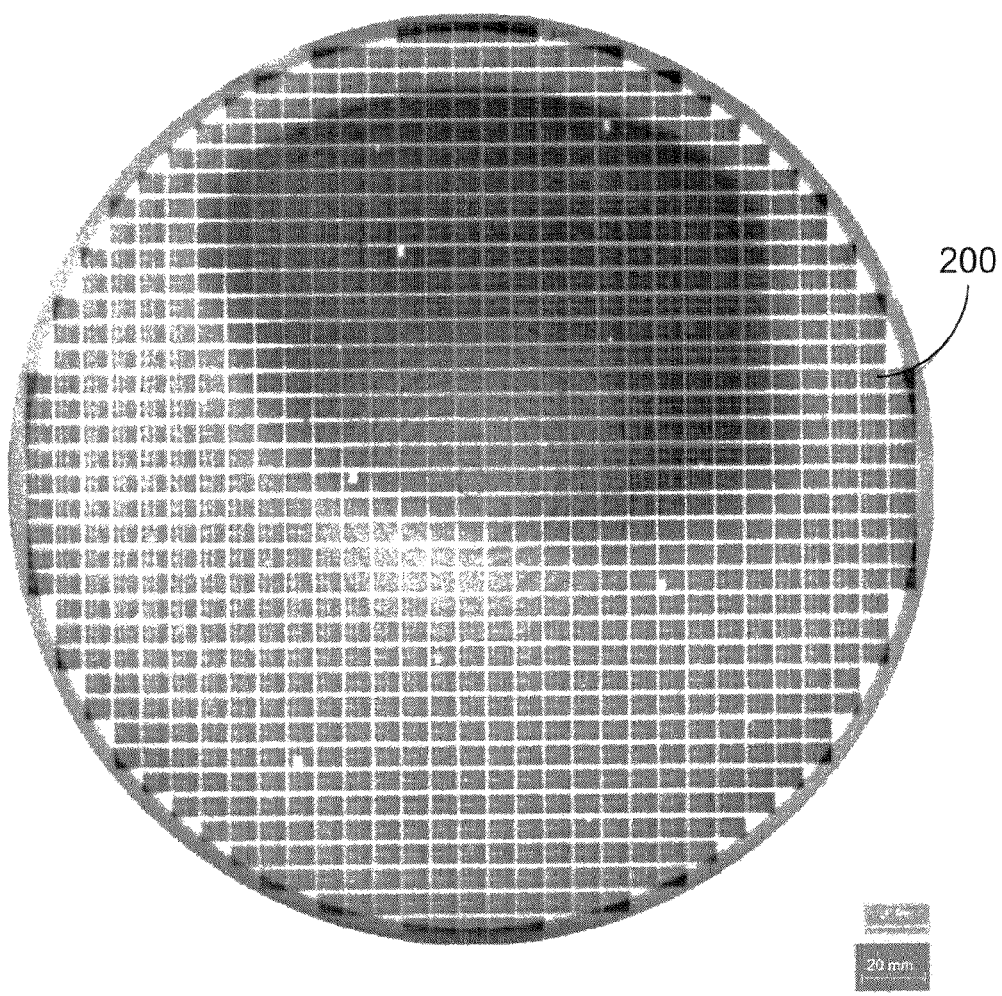
FIG. 13 shows the image in FIG. 12 after integration; and the integrated image shows regions of relative work function.

FIG. 13 shows the image in FIG. 12 after integration; and the integrated image shows regions of relative work function.

Example XIII

Figure 14:
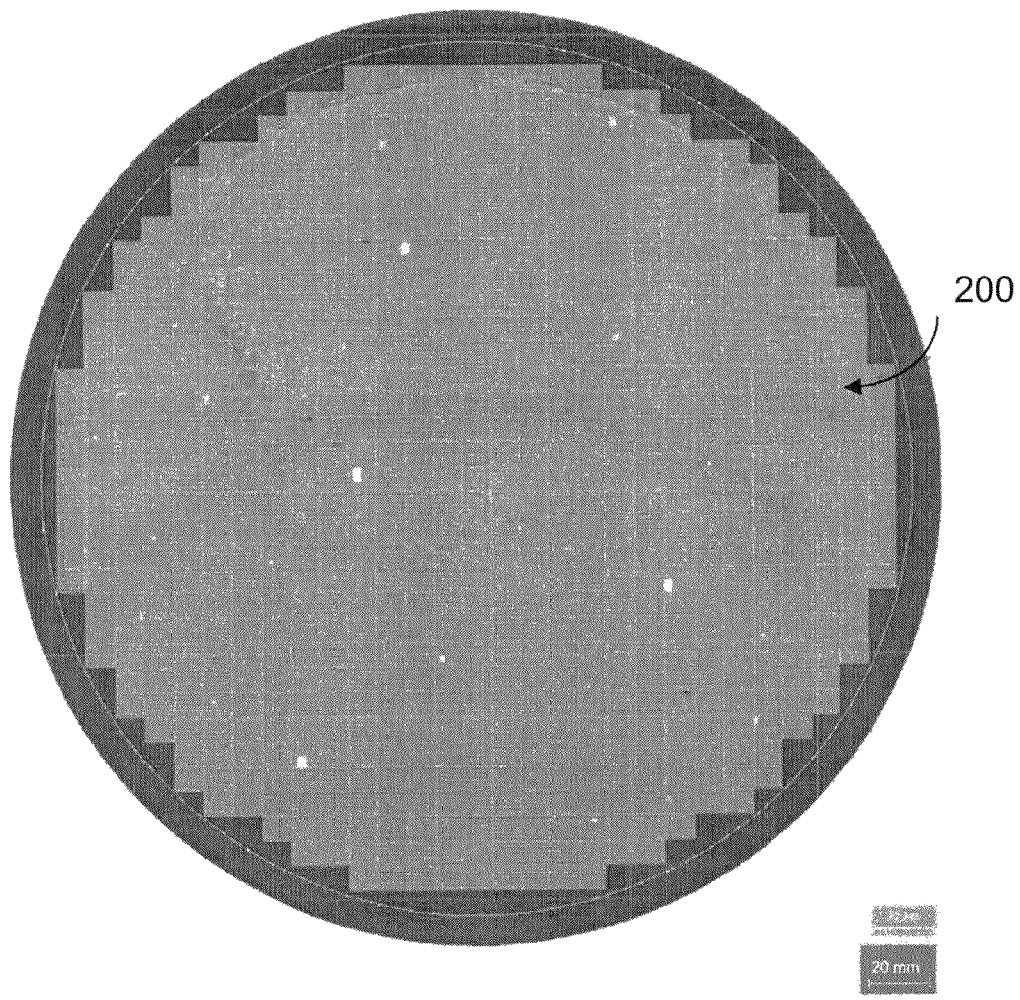
FIG. 14 shows the integrated wafer image in FIG. 13 after performing a die 200-to-die 200 subtraction operation.

FIG. 14 shows the integrated wafer image in FIG. 13 after performing a die 200-to-die 200 subtraction operation.

Example XIV

Figure 15:
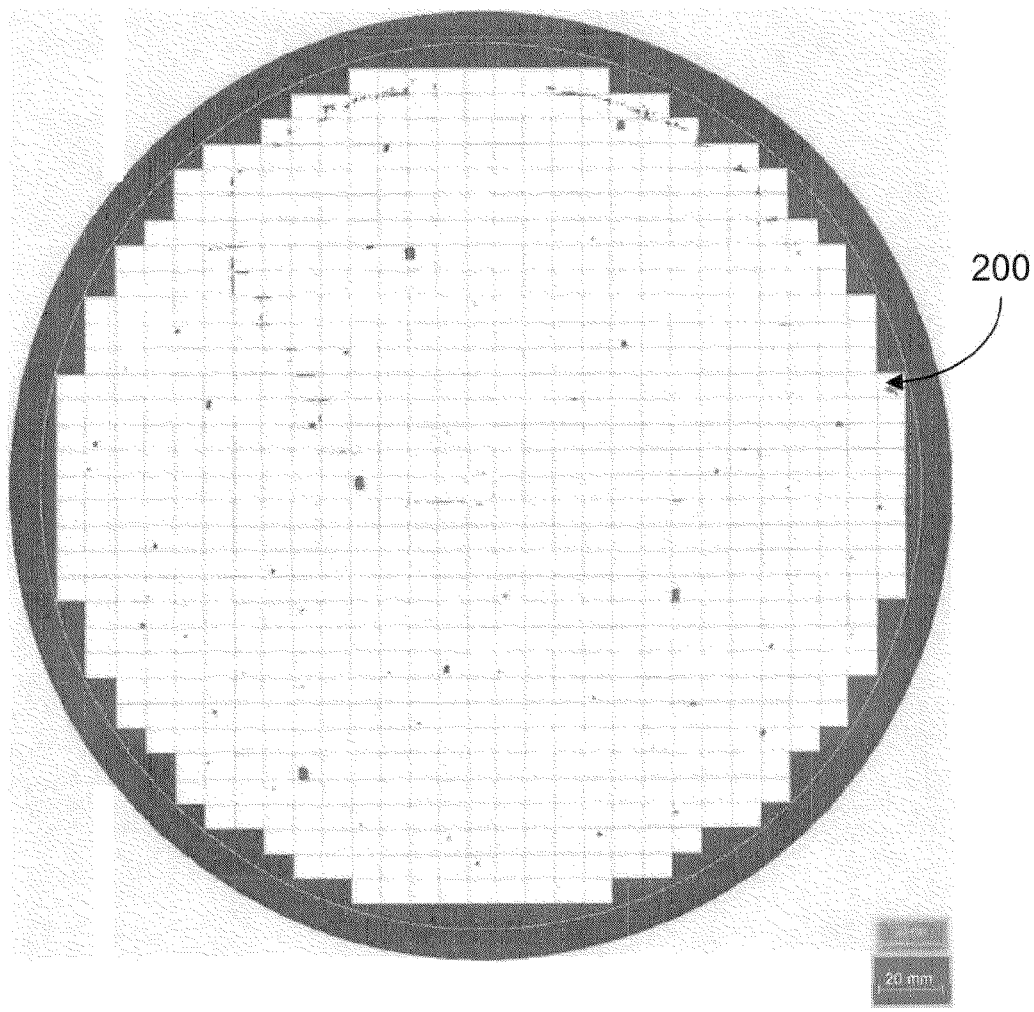
FIG. 15 shows the wafer image in FIG. 14 after thresholding; and all image values above a set threshold are shown in red.

FIG. 15 shows the wafer image in FIG. 14 after thresholding; and all image values above a set threshold are shown in red.

Example XV

Figure 16:
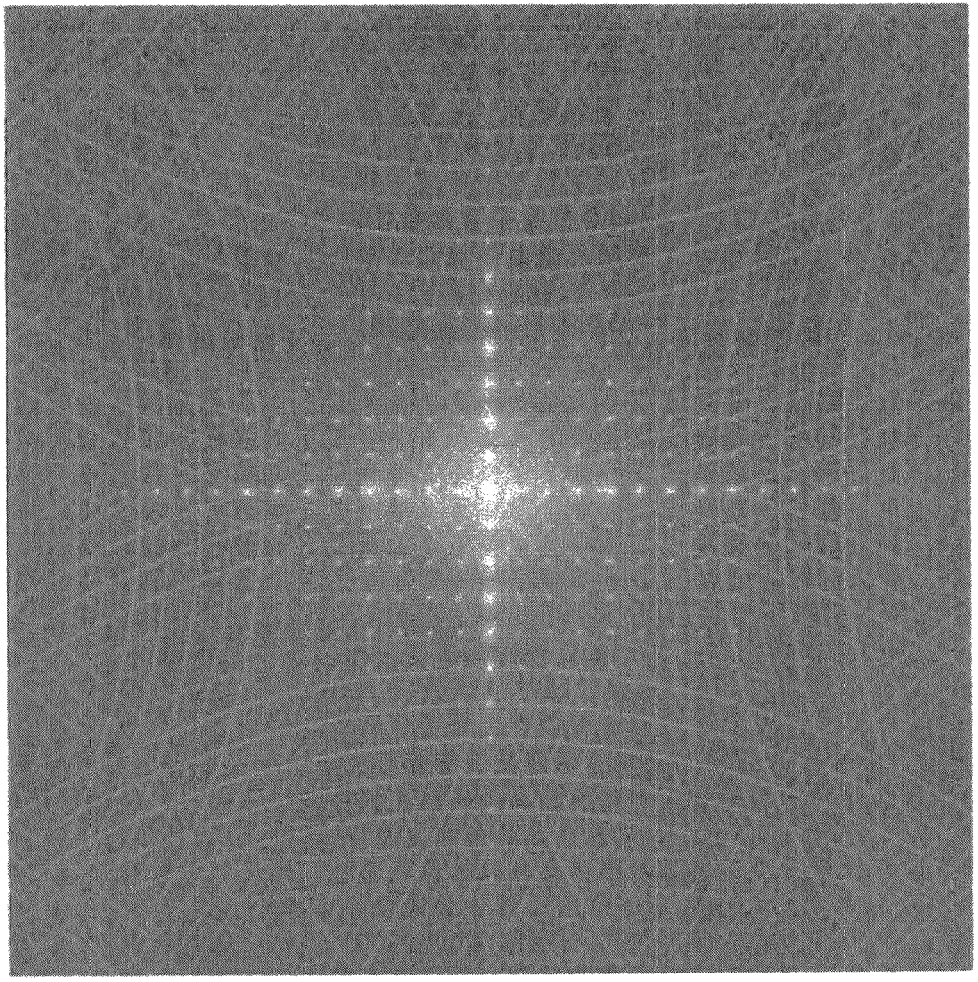
FIG. 16 shows a two dimensional Fourier transform of the image shown in FIG. 13 after conversion to Cartesian coordinates.

FIG. 16 shows a two dimensional Fourier transform of the image shown in FIG. 13 after conversion to Cartesian coordinates.

Example XVI

Figure 17:
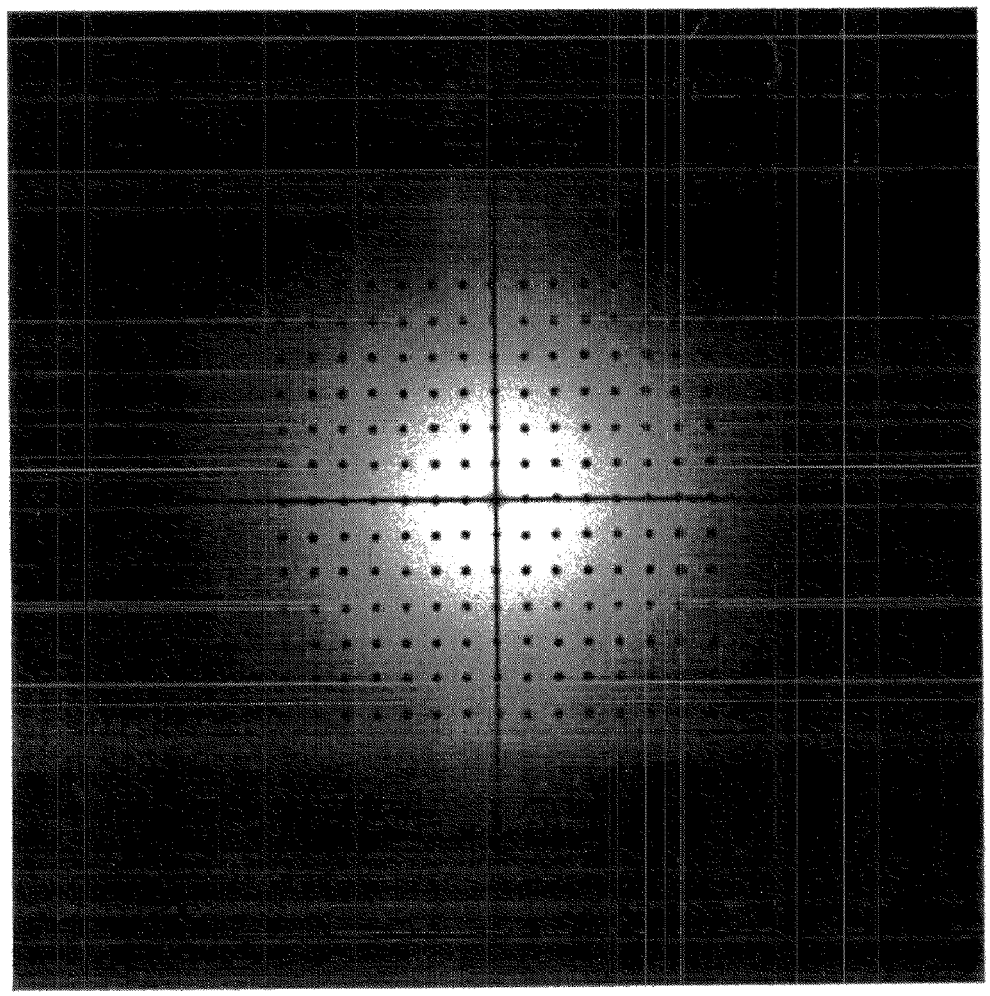
FIG. 17 shows a typical frequency domain filter for the image shown in FIG. 13.

FIG. 17 shows a typical frequency domain filter for the image shown in FIG. 13.

Example XVII

Figure 18:
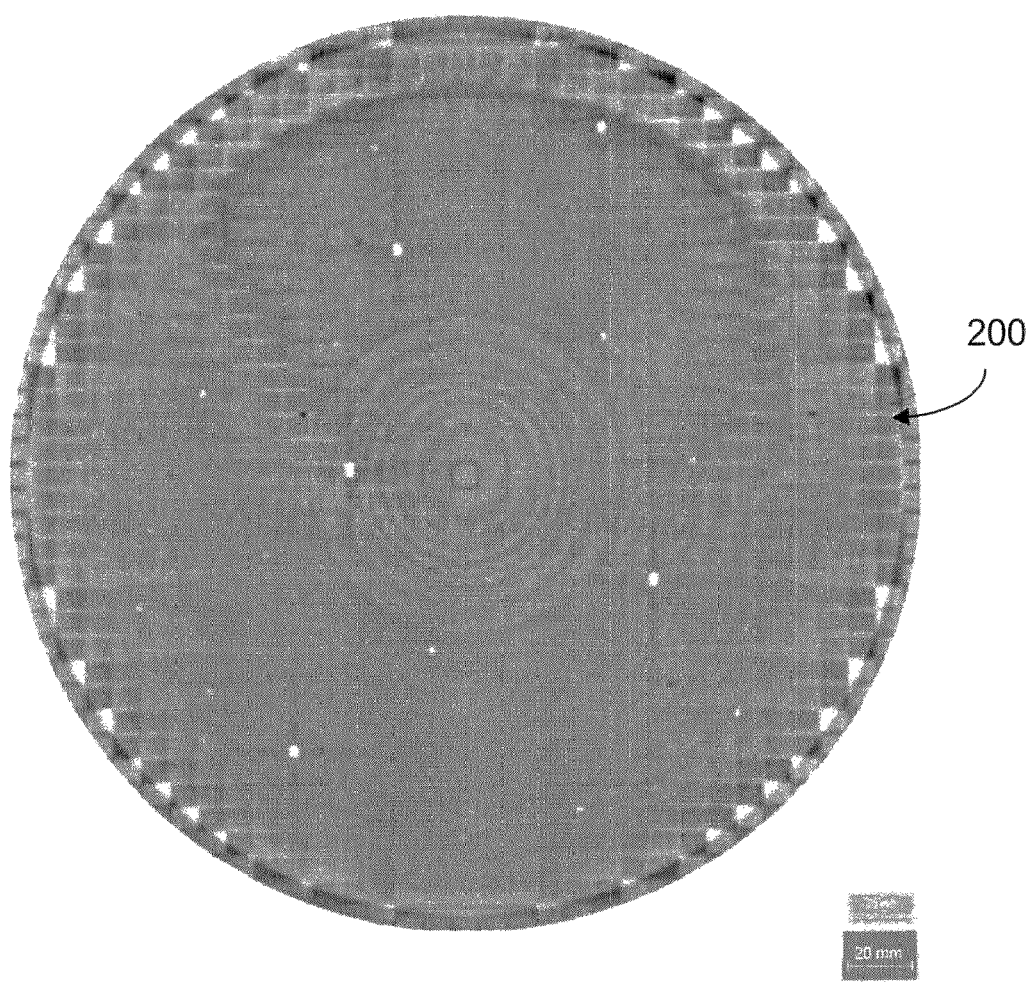
FIG. 18 shows the result of applying an inverse Fourier transform to the frequency domain image shown in FIG. 16 after applying the filter shown in FIG. 17.

FIG. 18 shows the result of applying an inverse Fourier transform to the frequency domain image shown in FIG. 15 after applying the filter shown in FIG. 17.

Example XVIII

Figure 19:
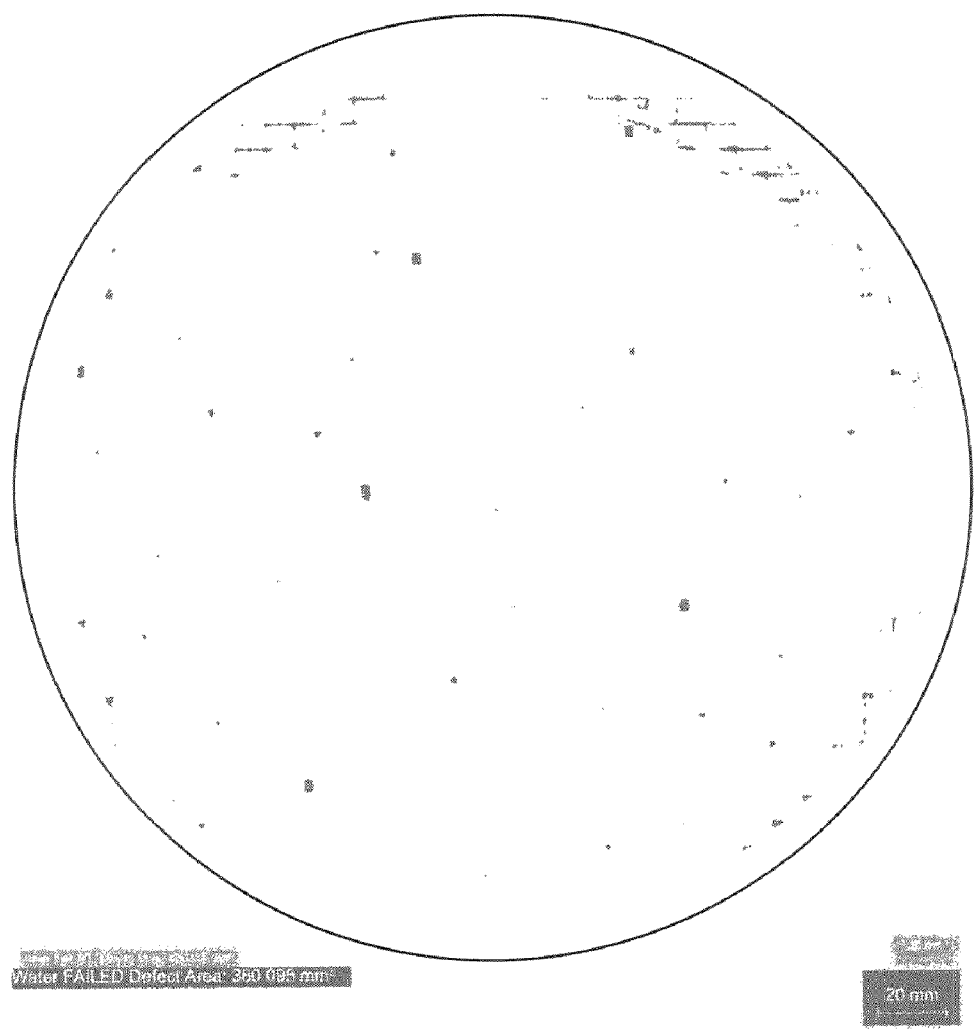
FIG. 19 shows the wafer image in FIG. 18 after thresholding.

FIG. 19 shows the wafer image in FIG. 18 after thresholding.

While preferred embodiments have been illustrated and described, it should be understood that changes and modifications can be made therein in accordance with one of ordinary skills in the art without departing from the invention in its broader aspects.

What is claimed is:

1. In a method of inspecting a surface of a material that contains a repeating pattern of relative work functions for detecting non-uniformities in the pattern, comprising the steps of:
providing a surface of a material; providing a non-vibrating contact potential difference sensor having a sensor probe tip; positioning the sensor probe tip a fixed distance above the surface of the material; continuously moving the surface and non-vibrating contact potential difference sensor relative to one another so that the probe tip moves parallel to the surface of the material; generating non-vibrating contact potential sensor data arising from the continuous motion of the sensor probe tip relative to the surface of the material, the sensor data representative of changes in contact potential difference between the sensor probe tip and the surface of the material; the improvement characterized by the steps of processing the sensor data to provide relative contact potential difference values; identifying relative contact potential difference data characteristic of the repeating pattern; processing the relative contact potential difference data to reduce effects of data characteristic of the repeating pattern and providing resulting data; and processing the resulting data to identify work function non-uniformities that are not part of the repeating pattern.

2. The method as defined in claim 1 wherein the steps processing the sensor data to produce data representative of relative contact potential difference values and of identifying relative contact potential difference data characteristics with the repeating pattern comprises the step of integrating the sensor data.

3. The method as defined in claim 1 wherein the step of processing to reduce effects of potential difference data characteristic of the repeating pattern comprises filtering the resulting data image in the frequency domain.

4. The method as defined in claim 1 where the step of processing to reduce effects of data characteristic of the repeating pattern comprises the steps of subtracting each instance of the repeated pattern from one or more instances of the pattern at other locations on the surface of the material to provide resulting difference data and combining the resulting difference data to identify features that are not part of the repeating pattern.

5. The method as defined in claim 1 where the step of processing the resulting data to identify work function non-uniformities that are not part of the repeating pattern comprises the steps of applying thresholds to the resulting data to identify relative work functions that are above or below specific values.

6. The method as defined in claim 1 where the sensor data are processed to reduce random or systematic noise.

7. The method as defined in claim 1 where the sensor data are processed to correct for size of the sensor probe tip.

8. The method as defined in claim 1 where the sensor data are processed to correct for time constant of sensor electronics of the sensor.

9. The method as defined in claim 2 where the resulting data are processed to reduce artifacts resulting from changes in the average surface potential of adjacent data tracks on the material.

10. The method as defined in claim 1 where the relative motion between the sensor probe tip and the material is generated by rotating the material beneath the probe tip.

11. The method as defined in claim 10 where the integrated radial data is converted to a Cartesian form prior to removal of the signal resulting from the repeating pattern.

12. The method as defined in claim 1 where the detected work function non-uniformity that is not part of the repeating pattern comprises one of a chemical non-uniformity on the surface or charge on the surface of the material.

13. A system for inspecting a material having a surface with a repeating pattern of relative work function thereon, comprising;
a non-vibrating contact potential difference sensor having a sensor probe tip;

a scanning assembly for continuously, laterally scanning the material relative to the sensor probe tip to provide sensor data representative of changes in contact potential difference values;

a computer having a memory with executable computer software program for analysis of the sensor data to identify relative contact potential data characteristic of the repeating pattern and processing the data characteristic of the repeating pattern to reduce effects of data characteristic of the repeating pattern and identify work function non-uniformities which are not part of the repeating pattern.

14. The system as defined in claim 13, wherein the computer software includes a program for integration of the sensor data to provide relative contact potential difference values data.

15. The system as defined in claim 13, further including computer software which converts the relative contact potential difference values to Cartesian coordinate data.

16. The system as defined in claim 13, wherein the computer software includes a program for suppressing the repeating pattern by frequency domain transformation, removal of frequencies associated with the repeating pattern and transformation of the relative contact potential difference values data back to a spatial domain.

* * * * *